(12) United States Patent
Nordquist et al.

(10) Patent No.: US 7,719,318 B1
(45) Date of Patent: May 18, 2010

(54) NANOELETROMECHANICAL SWITCH AND LOGIC CIRCUITS FORMED THEREFROM

(75) Inventors: Christopher D. Nordquist, Albuquerque, NM (US); David A. Czaplewski, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 80 days.

(21) Appl. No.: 12/265,200

(22) Filed: Nov. 5, 2008

(51) Int. Cl.
*H03K 19/20* (2006.01)

(52) U.S. Cl. ........................ 326/104; 977/940; 977/724; 257/415

(58) Field of Classification Search ................... 326/21, 326/104; 257/415; 361/56; 977/940, 724
See application file for complete search history.

(56) References Cited

U.S. PATENT DOCUMENTS

| | | | |
|---|---|---|---|
| 5,638,946 A | 6/1997 | Zavracky | |
| 6,534,839 B1* | 3/2003 | Frazier et al. | 257/421 |
| 6,548,841 B2 | 4/2003 | Frazier et al. | |
| 7,256,063 B2 | 8/2007 | Pinkerton et al. | |
| 7,355,258 B2 | 4/2008 | Valenzuela et al. | |
| 7,612,270 B1* | 11/2009 | Zhu | 326/104 |

OTHER PUBLICATIONS

Thomas Rueckes et al, "Carbon Nanotube-Based nonvolatile Random Access Memory for Molecular Computing", Science, 2000, vol. 289, pp. 94-97.
Changhong Ke, et al, "Feedback controlled nanocantilever device", Applied Physics Letters, vol. 85, No. 4, 2004, pp. 681-683.
M. L. Roukes, "Mechanical Computation, Redux?", Electron Devices Meeting, 2004, IEDM Technical Digest, IEEE International, Dec. 13-15, 2004, pp. 539-542.
Shinobu Fujita et at, "Novel architecture based on floating gate CNT-NEMS switches and its application to 3D on-chip bus beyond CMOS architecture", Sixth IEEE Conference on Nanotechnology, 2006, Jun. 17-20, 2006.
Hamed F. Dadgour et al, "Design and Analysis of Hybrid NEMS-CMOS Circuits for Ultra Low-Power Applications", DAC 2007, Jun. 4-8, 2007, San Diego, CA.
Qiliang Li et al, "Silicon nanowire electromechanical switches for logic device application", Nanotechnology, vol. 18, Jul. 6, 2007, pp. 1-5.
Adrian M. Ionescu et al, "Small Slope Micro/Nano-Electronic Switches", International Semiconductor Conference, Lausanne, France, Oct. 15-17, 2007.

(Continued)

*Primary Examiner*—Daniel D Chang
(74) *Attorney, Agent, or Firm*—John P. Hohimer

(57) ABSTRACT

A nanoelectromechanical (NEM) switch is formed on a substrate with a source electrode containing a suspended electrically-conductive beam which is anchored to the substrate at each end. This beam, which can be formed of ruthenium, bows laterally in response to a voltage applied between a pair of gate electrodes and the source electrode to form an electrical connection between the source electrode and a drain electrode located near a midpoint of the beam. Another pair of gate electrodes and another drain electrode can be located on an opposite side of the beam to allow for switching in an opposite direction. The NEM switch can be used to form digital logic circuits including NAND gates, NOR gates, programmable logic gates, and SRAM and DRAM memory cells which can be used in place of conventional CMOS circuits, or in combination therewith.

26 Claims, 15 Drawing Sheets

OTHER PUBLICATIONS

Shinobu Fujita et al, "3-D Nanoarchitectures with Carbon Nanotube Mechanical Switches for Future On-Chip Network Beyond CMOS Architecture", IEEE Transactions on Circuits and Systems—I:Regular Papers, vol. 54, No. 11, Nov. 2007, pp. 2472-2479.

Rajat Subhra Chakraborty et al, "Hybridization of CMOS with CNT-Based Nano-Electromechanical Switch for Low Leakage and Robust Circuit Design", IEEE Transactions on Circuits and Systems—I:Regular Papers, vol. 54, No. 11, Nov. 2007, pp. 2480-2488.

Kerem Akarvardar et al, "Analytical Modeling of the Suspended-Gate FET and Design Insights for Low-Power Logic", IEEE Transactions on Electron Devices, vol. 55, No. 1, Jan. 2008, pp. 48-59.

Joseph Heremans, "Nanomechanical Structures for Digital Logic", 2005 NNIN REU Research Accomplishments, pp. 48 and 49.

Woo Young Choi, "Compact Nano-Electro-Mechanical Non-Volatile Memory (NEMory) for 3D Integration", IEEE International Electron Devices Meeting, Washington, DC, Dec. 10-12, 2007.

K. Akarvardar et al, "Design Considerations for Complementary Nanoelectromechanical logic Gates", IEEE International Electron Devices Meeting, Washington, DC, Dec. 10-12, 2007.

Chun-Yin Tsai et al, "Design and fabrication of MEMS logic gates", Journal of Micromechanics and Microengineering, vol. 18, Feb. 22, 2008, pp. 1-10.

Sae-Won Lee, "MEMS Mechanical Logic Units: Design and Fabrication with Micragem and Polymumps", Canadian Conference on Electrical and Computer Engineering, 2005, May 1-4, 2005, pp. 1513-1516.

Shinobu Fujita et al, "Three-dimensional Logic Architecture by Four-terminal electrical Switches (FES) beyond Two-dimensional CMOS Architecture", NSTI-Nanotech 2005, pp. 213-216.

* cited by examiner

NAND Gate

| A | B | Output |
|---|---|--------|
| 0 | 0 | 1 |
| 0 | 1 | 1 |
| 1 | 0 | 1 |
| 1 | 1 | 0 |

FIG. 12A

NOR Gate

| A | B | Output |
|---|---|--------|
| 0 | 0 | 1 |
| 0 | 1 | 0 |
| 1 | 0 | 0 |
| 1 | 1 | 0 |

FIG. 12B

NANOELETROMECHANICAL SWITCH AND LOGIC CIRCUITS FORMED THEREFROM

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates to nanoelectromechanical (NEM) switching devices and to logic circuits formed therefrom.

BACKGROUND OF THE INVENTION

As CMOS transistors continue to be scaled down in size with each new generation, the sub-threshold leakage power (also referred to as the stand-by power) in these transistors becomes an increasing fraction of the total power dissipation. This has lead researchers to explore potential alternatives to CMOS technology. NEM switching devices, when used as a replacement for CMOS transistors or used in combination with CMOS transistors promise to substantially reduce or eliminate the sub-threshold leakage power which is present with CMOS transistors. NEM switching devices also promise advantages in terms of increased radiation hardness and higher temperature operation as compared to CMOS transistors.

In NEM switching devices, a flow of electrical current between source and drain electrodes is controlled electrically and mechanically using a cantilever arm which moves in response to an applied gate voltage to make or break an electrical connection between the source and drain electrodes. Removing the gate voltage from the NEM switching device interrupts the electrical connection between the source and drain electrodes, thereby resulting in an extremely low leakage current which is due to Brownian motion of the cantilever arm and tunneling.

Over the past decade, numerous designs for NEM switching devices have been proposed (see e.g. U.S. Pat. Nos. 5,638,946; 6,548,841; 7,256,063 and 7,355,258) which have been primarily based on the use of cantilever arms which are electrostatically actuated to move into contact with an underlying drain electrode. Carbon nanotubes are also being explored for use in NEM switching devices (see e.g. U.S. Pat. No. 7,256,063).

The present invention provides a NEM switching device in which the source electrode comprises an electrically-conductive beam which is suspended above a substrate and anchored at each end thereof to the substrate. This arrangement provides a higher restoring force and a higher resonant frequency than devices which utilize cantilever arms, thereby promising faster turn-on and turn-off times, and also being less susceptible to stiction (i.e. adhesion of the beam to a drain electrode). This arrangement also avoids problems of curl-up of cantilever arms due to internal stress, and stiction of the cantilever arms to the drain electrode upon release of the cantilever arms.

The NEM switching device of the present invention utilizes an electrically-conductive beam which can be formed of ruthenium metal with a ruthenium oxide coating thereon. The ruthenium oxide coating, which can be optionally provided on the NEM switching device of the present invention, is useful to prevent carbon fouling of contacting surfaces of the NEM switch to improve device reliability.

The NEM switching device of the present invention can also be formed with gate and drain electrodes located on both sides of the electrically-conductive beam. This can be advantageous to provide a single pole double throw (SPDT) switching of the device. This can also be advantageous when forming logic circuits from a plurality of NEM switching devices. In such logic circuits, logic state inputs can be provided to the gate electrodes on one side of the electrically-conductive beam while the gate electrodes on the other side of the electrically-conductive beam can be used as disable inputs to disable that logic circuit, as needed, and to provide an output which is either electrically floating (i.e. electrically disconnected from the inputs or any power supply voltage) or tied to a power supply voltage (either $V_{dd}$ or $V_{ss}$). The use of disable inputs to the logic circuit when it is in a stand-by mode reduces the power consumption for that logic circuit and for any other logic circuits which are connected to it. These disable inputs also provide an ability to reconfigure a logic circuit by removing one or more NEM switching devices from the logic function.

The NEM switching device of the present invention can also be used to form programmable logic circuits which can be programmed, as needed, to change from being NAND gates to being NOR gates.

Additionally, the NEM switching device of the present invention can be used to form memory cells including SRAM and DRAM memory cells.

SRAM memory cells can be formed according to the present invention with a cross-coupled data latch which requires only two NEM switching devices as compared to the normal four transistors in conventional CMOS SRAM memory cells. The SRAM memory cells formed using the NEM switching devices of the present invention will also have a near-zero stand-by power consumption due to a push-pull operation resulting from the gates and drains located on opposite sides of the electrically-conductive beam and also due to the extremely low leakage current of the NEM switching devices.

DRAM memory cell arrays can be formed according to the present invention which require only one-half the number of NEM switching devices compared to conventional CMOS DRAM memory cell arrays since each NEM switching device is capable of addressing two storage capacitors. Each DRAM memory cell formed according to the present invention will also have a much lower leakage current compared to a conventional CMOS DRAM memory cell; and this will allow a longer charge retention time.

These and other advantages of the present invention will become evident to those skilled in the art.

SUMMARY OF THE INVENTION

The present invention relates to a nanoelectromechanical (NEM) switching device (also referred to as a NEM switch) which comprises a substrate with a source electrode having an electrically-conductive beam suspended above the substrate and anchored at each end thereof to the substrate. A drain electrode is located on the substrate proximate to a midpoint of the electrically-conductive beam on one side thereof, and is separated from the electrically-conductive beam by a first gap. A pair of gate electrodes are electrically connected together and located on the substrate on the same side of the electrically-conductive beam as the drain electrode, and are separated from the electrically-conductive beam by a second gap which is larger than the first gap. Each gate electrode of the pair of gate electrodes is located adjacent to the drain electrode on a different side thereof. When an actuation voltage is applied between the pair of gate electrodes and the source electrode, the electrically-conductive beam is urged to bow towards the drain electrode in a direction substantially parallel to the substrate. This forms an electrical connection between the source electrode and the drain electrode.

Another pair of gate electrodes can be provided in the NEM switch with this pair of gate electrodes being electrically connected together and located on the substrate on a side of the electrically-conductive beam opposite the drain electrode. Another drain electrode can also be provided in the NEM switch, with the two drain electrodes being located opposite each other on different sides of the electrically-conductive beam.

The substrate can comprise, for example, silicon (i.e. a bulk silicon substrate or a silicon-on-insulate substrate); and the electrically-conductive beam can comprise ruthenium metal (i.e. ruthenium or a ruthenium alloy) with an optional coating of ruthenium oxide formed over at least a portion of the ruthenium metal. The electrically-conductive beam can have a length of generally $\leqq 10$ microns and a width which is generally $\leqq 0.1$ microns.

The present invention also relates to a NEM switching device which comprises a substrate; a source electrode comprising an electrically-conductive beam suspended above the substrate and anchored at each end thereof to the substrate; a pair of drain electrodes located on the substrate proximate to a midpoint of the electrically-conductive beam, with each drain electrode being located on a different side of the electrically-conductive beam and being separated therefrom by a first gap; and two pairs of gate electrodes located on the substrate on different sides of the electrically-conductive beam and separated therefrom by a second gap which is larger than the first gap. In response to a gate voltage which is applied to one pair of gate electrodes, the electrically-conductive beam is urged to bow towards that pair of gate electrodes, thereby forming an electrical connection between the source electrode and the drain electrode which is located between that pair of gate electrodes.

The substrate can comprise a semiconductor substrate (e.g. a bulk silicon substrate or a silicon-on-insulator substrate). The electrically-conductive beam can be formed with a length of generally $\leqq 10$ microns and a width of generally $\leqq 0.1$ microns. The electrically-conductive beam preferably comprises ruthenium metal, and can also include a ruthenium oxide coating over at least a portion of the ruthenium metal.

The second gap on one side of the electrically-conductive beam can be the same as the second gap on the other side of the electrically-conductive beam. This is useful when substantially the same gate voltage is desired to form the electrical connection between the source electrode and each drain electrode. In certain embodiments of the present invention, however, the second gap can be made different between the electrically-conductive beam and each pair of gate electrodes. This is useful to provide different gate voltages for forming the electrical connection between the source electrode and each drain electrode (e.g. when a first gate voltage is used as a logic state input and a second gate voltage is used as a disable input).

The present invention is further related to a digital logic circuit which comprises a plurality of interconnected NEM switching devices, with each NEM switching device further comprising a substrate; a source electrode having an electrically-conductive beam which is suspended above the substrate and anchored at each end thereof to the substrate; a pair of drain electrodes located on the substrate on opposite sides of the electrically-conductive beam, with each drain electrode being oriented substantially perpendicular to the electrically-conductive beam near a midpoint thereof and being separated from the electrically-conductive beam by a first gap; and two pairs of gate electrodes located on the substrate, with each pair of gate electrodes being located on a different side of the electrically-conductive beam and being separated therefrom by a second gap which is larger than the first gap, and with each pair of gate electrodes at least partially surrounding one of the drain electrodes, and with each pair of gate electrodes, in response to a voltage applied between that pair of gate electrodes and the source electrode, urging the electrically-conductive beam to bow towards that pair of gate electrodes to form an electrical connection between the source electrode and the drain electrode which is at least partially surrounded by that pair of gate electrodes.

The voltage provided to one of the two pairs of gate electrodes in each NEM switching device can provide a logic state input to that NEM switching device; and the voltage provided to the other of the two pairs of gate electrodes in each NEM switching device can provide a disable input to that NEM switching device. The voltage for the logic state input can either be the same or different from the voltage for the disable input. The disable input is useful to render that NEM switching device unresponsive to the logic state input.

The digital logic circuit can include one or more NAND gates formed from the plurality of interconnected NEM switching devices. Each NAND gate can have a plurality of logic state inputs and a plurality of disable inputs to provide an output which is determined by a NAND function of the logic state inputs when the disable inputs are in a first logic state, with the output being electrically floating or tied to a power supply voltage (e.g. $V_{ss}$) when the disable inputs are in a second logic state. Alternately, or in addition to the NAND gates, the digital logic circuit can include one more NOR gates formed from the plurality of interconnected NEM switching devices. Each NOR gate can have a plurality of logic state inputs and a plurality of disable inputs to provide an output which is determined by a NOR function of the logic state inputs when the disable inputs are in a first logic state, with the output being electrically floating or tied to a power supply voltage (e.g. $V_{dd}$) when the disable inputs are in a second logic state.

In some embodiments of the present invention, the digital logic circuit can include one or more programmable logic gates which can be switched between different types of logic functions (e.g. between a NAND logic function and a NOR logic function). This can be done using a pair of the NEM switching devices to switch power supply connections to the programmable logic gates.

The digital logic circuit formed according to the present invention can also include one or more SRAM memory cells which are formed, at least in part, from the plurality of interconnected NEM switching devices.

The digital logic circuit of the present invention can also include one or more cross-coupled data latches formed from the plurality of interconnected NEM switching devices. Each cross-coupled data latch can be used, for example, to form a core of a SRAM memory cell.

In some cases, the digital logic circuit of the present invention can include a plurality of DRAM memory cells which are formed from the plurality of interconnected NEM switching devices. Each DRAM memory cell comprises two storage capacitors which are electrically connected to one of the NEM switching devices to store two bits of information, with each storage capacitor being independently accessed using one pair of the gate electrodes in that NEM switching device.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings:

FIG. 12A shows a logical truth table for the NAND gates of FIGS. 8 and 9.

FIG. 12B shows a logical truth table for the NOR gates of FIGS. 10 and 11.

DETAILED DESCRIPTION OF THE INVENTION

Figure 1:
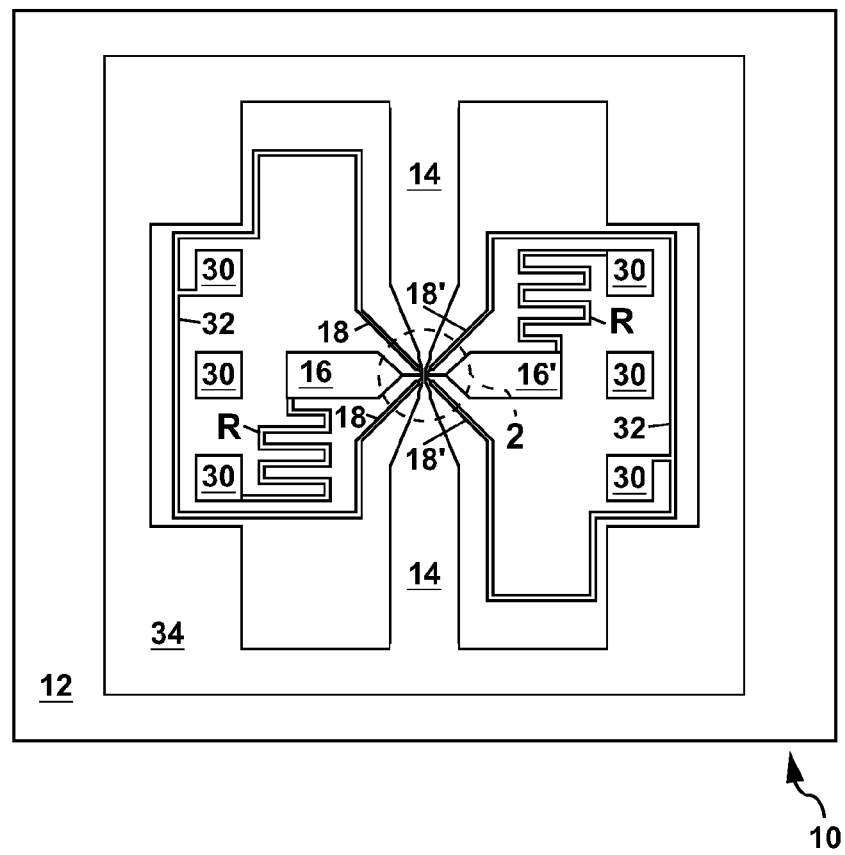
FIG. 1 shows a schematic plan view of a NEM switching device formed according to the present invention.
Figure 2:
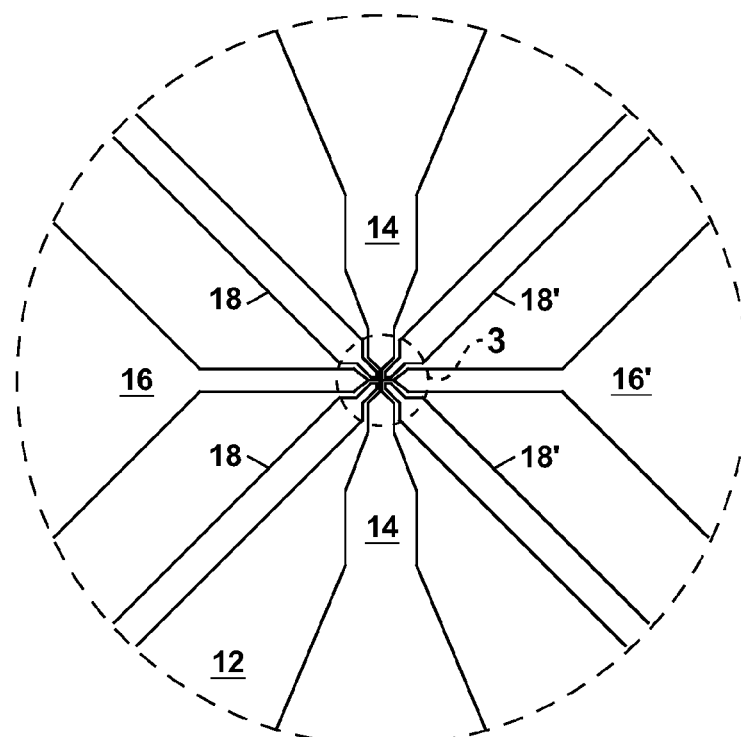
FIG. 2 shows an expanded partial view of the NEM switching device of FIG. 1.

Referring to FIG. 1, there is shown a schematic plan view of an example of the NEM switching device 10 of the present invention. The NEM switching device 10, which is also referred to herein as a NEM switch or a NEM transistor, comprises a substrate 12 with a source electrode 14, two drain electrodes 16 and 16' and two pairs of gate electrodes 18 and 18'. FIG. 2 shows an enlarged view of a portion of the device 10 of FIG. 1; and FIG. 3 shows an enlarged view of a portion of the enlarged view of FIG. 2 to better show details of the electrodes 14, 16, 16', 18 and 18' which have extremely small dimensions down to about 100 nanometers (nm) or less.

Figure 3:
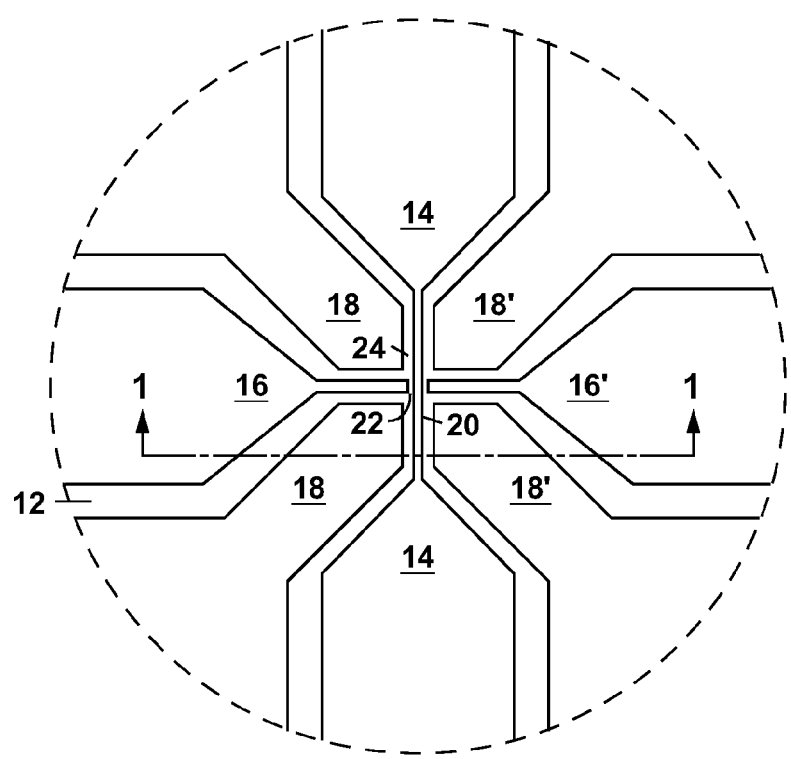
FIG. 3 shows another expanded partial view of the NEM switching device of FIG. 2 to show the electrically-conductive beam of the source electrode and the arrangement of the drain and gate electrodes on either side of the electrically-conductive beam.

As can be seen from the enlarged view of FIG. 3, the source electrode 14 extends between the drain electrodes 16 and 16' and two pairs of gate electrodes 18 and 18' and is necked down to form an electrically-conductive beam 20, with one of the drain electrodes 16 and 16' being located on each side of the beam 20 and extending outward substantially perpendicular to the beam from a location which is proximate to a midpoint of the beam 20. The electrically-conductive beam 20 is suspended above the substrate and anchored thereto by the remainder of the source electrode 14. The midpoint of the electrically-conductive beam can move laterally (i.e. parallel to the substrate 12) to make or break an electrical connection between the source electrode 14 and one of the drain electrodes 16 and 16' in response to an actuation voltage V applied between the source electrode 14 and one of the pairs of gate electrodes 18 and 18' (see FIG. 4). In the absence of the actuation voltage V, the electrically-conductive beam 20 will be centered between the two drain electrodes 16 and 16' and the two pair of gate electrodes 18 and 18' as shown in FIG. 3.

A gap 22 is present between the electrically-conductive beam 20 and each drain electrode 16 and 16', with the gap 22 being sufficiently large to prevent any substantial tunneling current from being present between the beam 20 and either of the two electrodes 16 and 16' when the switch 10 is in an "off" state as shown in FIG. 3. This gap 22 can be, for example, in a range of 20-75 nm. A larger gap 24 exists between the electrically-conductive beam 20 and each pair of gate electrodes 18 and 18' in the "off" state as shown in FIG. 3. The gap 24 can be, for example, in the range of 30-100 nm, and will generally be at least 10 nm larger than the gap 22 so that the beam 20, when actuated will contact the drain electrode 16 or 16' without coming into contact with one of the pairs of electrodes 18 or 18' which could result in an electrical short circuit between the electrodes 18 or 18' and the source electrode 14. The exact gaps 22 and 24 will, in general, depend upon the length and width of the electrically-conductive beam 20, which, in turn, will depend upon a desired actuation voltage V for the NEM switch 10. The length of the beam 20 can be about 10 microns (µm) or smaller; and the width of the beam 20 can be about 100 nm (i.e. 0.1 µm) or less.

In some embodiments of the present invention, the gaps 24 on each side of the electrically-conductive beam 20 will be the same to provide the same actuation voltage V for switching in each direction (i.e. to form an electrical connection between the source electrode 14 and the drain electrode 16 in one switching direction, and to form an electrical connection between the source electrode 14 and the drain electrode 16' in an opposite switching direction). In other embodiments of the present invention, the gaps 24 on each side of the electrically-conductive beam 20 can be different to provide different actuation voltages $V_1$ and $V_2$ for switching in the two different directions (i.e. with the voltage $V_1$ being applied to the pair of gate electrodes 18 to form the electrical connection between the source electrode 14 and the drain electrode 16, and with the voltage $V_2$ being applied to the pair of gate electrodes 18' to form the electrical connection between the source electrode 14 and the drain electrode 16').

Theoretical modeling of the NEM switch 10 of FIGS. 1-3 indicates that lower actuation voltages V can be achieved with an increased length of the beam 20 and with a smaller width thereof. The actuation voltage V can also be reduced by reducing the size of the gaps 22 and 24. On the other hand, to obtain a faster switching time between "off" and "on" states of the NEM switch 10 generally requires a smaller length of the beam 20 and a larger width thereof which results in an increased actuation voltage V. As an example, theoretical modeling indicates that switching of a NEM device 10 with a beam length of 1.5 µm and a beam width of 20 nm and electrode gaps 22 and 24 of 20 nm and 30 nm, respectively, can be performed with an actuation voltage of 7 Volts and a switching time of 9 ns. As another example, the theoretical modeling shows that the actuation voltage can be reduced to about 2 Volts in a NEM device 10 having a 10-µm-long beam 20 with a 100-nm-width with electrode gaps 22 and 24 of 20 nm and 40 nm, respectively. The switching time for this latter example is about 80 ns.

Figure 4:
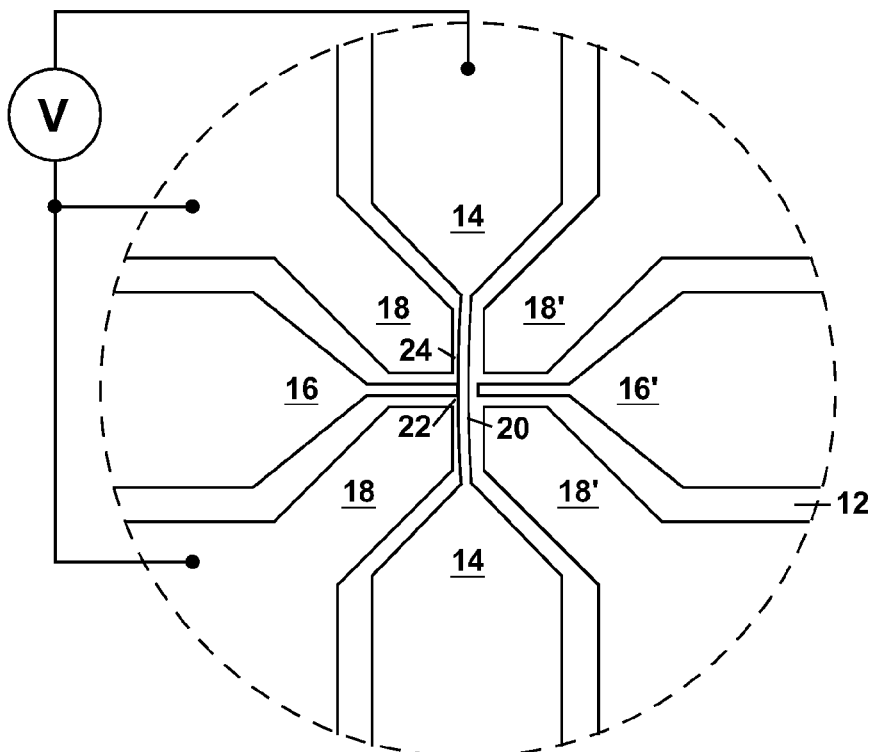
FIG. 4 illustrates operation of the NEM switching device with the electrically-conductive beam being bowed toward the pair of gate electrodes on the left-hand side of FIG. 4 in response to an actuation voltage V applied between that pair of gate electrodes, thereby completing an electrical connection between the source electrode and the drain electrode.

FIG. 4 schematically illustrates operation of the NEM switch 10 with the application of the actuation voltage V between the pair of gate electrodes 18 and the source electrode 14. The voltage V generates an electrostatic force of attraction which urges the beam 20 to bow towards the gate electrodes 18 until the beam 20 comes into contact with the drain electrode 16, thereby forming an electrical connection between the source electrode 14 and the drain electrode 16 corresponding to the "on" state of the NEM switch 10. In the "on" state, the actuation voltage V can be reduced since the electrostatic force of attraction between the beam 20 and the gate electrodes 18 is increased due to a narrowing of the gap 24.

To turn the NEM switch 10 "off", the actuation voltage V can be removed. This allows a restoring force produced by the bowed beam 20, which acts as a spring, to return the beam 20 to its initial state as shown in FIG. 3. Any electrostatic force of attraction between the drain electrode 16 and the source electrode 14 will be small compared to the restoring force produced by the bowed beam 20 and also by the small size of the drain electrode 16 which can be, for example, 100-200 nm wide. Additionally, a drain pull-up resistor R can be provided as shown in FIG. 1 to reduce an "on" state voltage drop between the drain electrode 16 and the source electrode 14.

With the NEM switch 10 in the "off" state as shown in FIG. 3, the actuation voltage V can be applied between the source electrode 14 and the other pair of gate electrodes 18' to switch the NEM switch 10 "on" to form an electrical connection between the source electrode 14 and the other drain electrode 16'. Thus, the NEM switch 10 of FIGS. 1-4 can be used as a single throw double pole (SPDT) switch.

Figure 5:
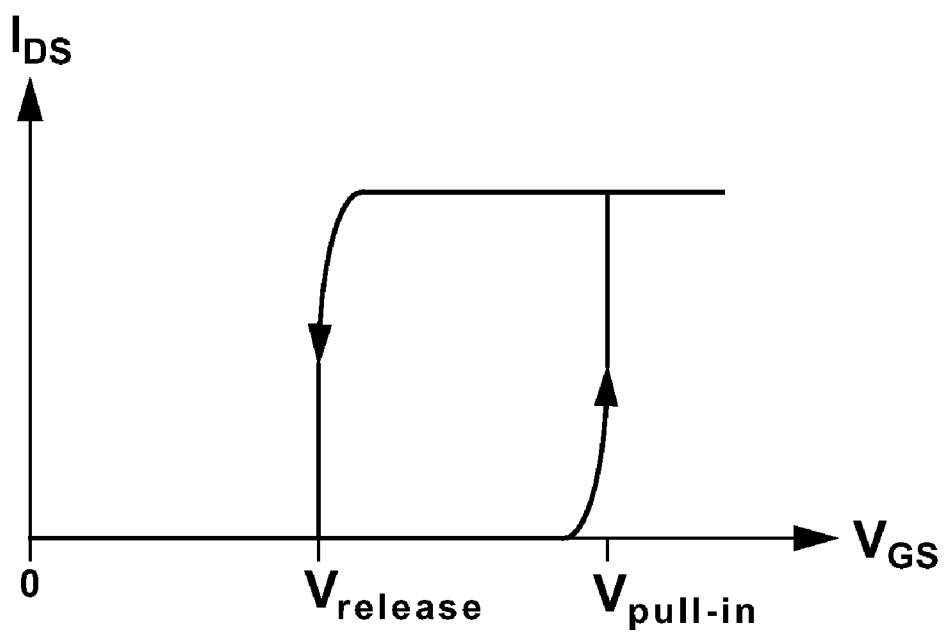
FIG. 5 shows a characteristic curve of the drain-to-source current $I_{DS}$ as a function of the gate-to-source voltage $V_{GS}$ for the NEM switch of FIGS. 1-4.

FIG. 5 shows a characteristic curve of the drain-to-source current $I_{DS}$ as a function of the gate-to-source voltage $V_{GS}$ (i.e. the actuation voltage V applied between one of the pair of gate electrodes 18 or 18' and the source electrode 14) for the NEM switch 10 of the present invention. In FIG. 5, as the actuation voltage is increased, the switch 10 remains in the "off" state until the actuation voltage reaches a pull-in voltage $V_{pull-in}$ at which time the electrostatic force of attraction is sufficient to bow the beam 20 and urge the beam 20 into contact with the drain electrode 16. This switches the NEM device 10 to the "on" state. The NEM switch 10 then remains in the "on" state as the actuation voltage is reduced to a value $V_{release}$ at which point the restoring force of the bowed beam 20 overcomes the electrostatic force of attraction to release the beam 20 to return to its initial state, thereby switching the NEM device 10 to the "off" state.

The characteristic curve of FIG. 5 does not depend upon the polarity of the actuation voltage $V_{GS}$. This is different from conventional n-channel and p-channel metal oxide semiconductor transistors (also referred to as NMOS and PMOS transistors, and together as CMOS transistors) since only NMOS transistors turn-on with a positive value of $V_{GS}$, and only PMOS transistors turn-on with a negative value of $V_{GS}$. This means that identical NEM devices 10 can be used to provide both the pull-up and pull-down functions in complementary logic circuits. The characteristic curve in FIG. 5 for the NEMS switch 10 of the present invention also shows very sharp turn-on and turn-off characteristics which is advantageous to substantially reduce or eliminate the sub-threshold leakage power present with conventional CMOS transistors.

Figure 6:
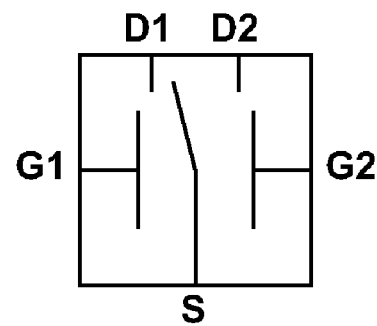
FIG. 6 shows an electrical equivalent circuit (i.e. a symbol) for the NEM switch of FIGS. 1-4. A mirror image of the symbol in FIG. 6 can also be used for the NEM switch of the present invention.

FIG. 6 shows an electrical equivalent circuit of the NEM switch 10 of the present invention. The electrical equivalent circuit of FIG. 6 or a mirror image thereof will be used hereinafter to represent the NEM switch 10 in schematic diagrams of logic circuits and memory elements formed using the NEM switch 10.

Returning to FIG. 1, fabrication of the NEM switch 10 of FIGS. 1-3 will now be described in detail with reference to FIGS. 7A-7H which show a series of schematic cross-section details of the NEM switch 10 along the section line 1-1 in FIG. 3. The NEM switch 10 can be fabricated using conventional integrated circuit (IC) fabrication processes together with certain nanofabrication processes which will be described hereinafter.

The various steps used to form the NEM switch 10 of the present invention can be performed at relatively low temperatures of about 400° C. or less so as to be compatible with back-end of the line processing for CMOS ICs. This is advantageous for embodiments of the present invention wherein CMOS transistors and NEM switches 10 are to be fabricated on the same substrate 12. In these embodiments, the CMOS transistors can be fabricated first using well-known IC fabrication processes, and then a plurality of NEM switches 10 can be fabricated on the substrate 12 in a space reserved for the switches 10 on the common substrate 12, or even above the CMOS transistors on a different level. One or more levels of interconnect wiring can then be provided on the substrate 12 to interconnect the CMOS transistors and the NEM switches 10.

To begin fabrication, a substrate 12 is provided on which a plurality of NEM switches 10 can be fabricated in a batch process. The substrate 12 can comprise a high-resistance silicon substrate which is useful to provide a reduced pad and trace capacitance for high-speed operation of the NEM switches 10. The silicon substrate 12 can be either a bulk silicon substrate or a silicon-on-insulator substrate. The use of a silicon substrate 12 is particularly useful to allow a plurality of NEM switches 10 to be used in combination with conventional CMOS circuitry which can be formed on the substrate 12 prior to forming the NEM switches 10.

Those skilled in the art will understand that other types of substrates can be used for supporting one or more of the NEM switches 10 of the present invention, including substrates 12 formed of glass, sapphire, fused silica, diamond, alumina, ceramics, and other types of semiconductors including group IV, group III-V and group II-VI semiconductors. Those skilled in the art will also understand that one or more NEM switches 10 of the present invention can be fabricated on virtually any smooth planar material or on any material layer which can be planarized to provide a surface topography which is compatible with a feature size of the NEM switches 10. As an example, when a layer of graphene is formed on the substrate 12 to fabricate CMOS circuitry in the graphene layer, one or more NEM switches can be fabricated on the graphene layer or on a passivation layer formed over the graphene layer. As another example, a plurality of NEM switches 10 of the present invention can be vertically stacked one above the other on different layers of a non-conductive material such as silicon dioxide, silicon nitride, or a silicate glass such as TEOS and interconnected by vias extending through the layers of the non-conductive material to form a three-dimensional (3-D) integrated circuit.

Figure 7A:
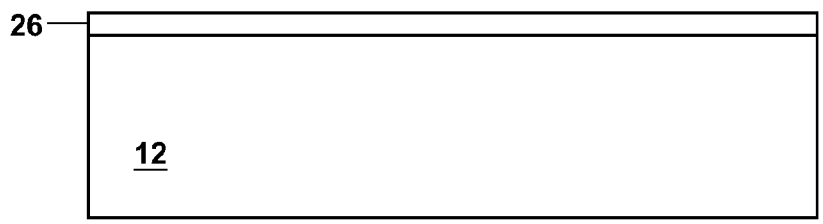
FIGS. 7A-7H show a series of schematic cross-section views of the NEM switch along the section line 1-1 in FIG. 3 to illustrate steps in the fabrication of the NEM switch.

In FIG. 7A, a layer 26 of a thermal oxide can be formed on the silicon substrate 12. This can be done using a thermal oxidation process in which the silicon substrate is heated to an elevated temperature (e.g. 900-1100° C.) in an oxygen or moist ambient for sufficient time to convert an exposed surface portion of the silicon substrate 12 into silicon dioxide. When CMOS circuitry is to be formed on the silicon substrate 12 prior to forming one or more MEM switches 10, the thermal oxide layer 26 can be formed as a part of the process for forming the CMOS circuitry. The thermal oxide layer can be, for example, about 0.5 µm thick.

After the thermal oxidation step, pull-up resistors R can be optionally formed on the thermal oxide layer 26 as shown in the example of FIG. 1. This can be done, for example depositing a layer of tantalum nitride (not shown) on the substrate 12 by evaporation or sputtering and patterning the tantalum nitride by etching or lift-off to form a serpentine pattern for each resistor R which can have a resistance of, for example, 100 kiloOhms (kΩ). The pull-up resistors R can be omitted when the NEM switch 10 is used to form a digital logic circuit.

A silicon nitride layer (not shown) can then be blanket deposited over the substrate 12 by plasma-enhanced chemical vapor deposition (PECVD). The silicon nitride layer can be, for example, about 0.6 µm thick. Openings can be etched in the silicon nitride layer at the locations where each MEM switch 10 will be formed and also to expose the ends of each pull-up resistor R.

Figure 7B:
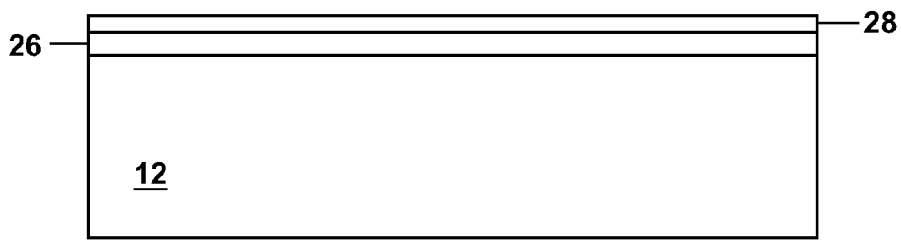

In FIG. 7B, a layer 28 of metal can be sputter deposited over the substrate 12 for use in forming the various electrodes 14, 16, 16', 18 and 18' and the electrically-conductive beam 20, and also for forming contact pads 30, wiring 32 and a ground plane 34 for the MEM switch 10 in the example of FIG. 1. The metal layer 28 can be deposited, for example, at a temperature of about 250° C. to provide a low residual stress for the layer 28. Although other types of metals and metal alloys can be used for the electrodes 14, 16, 16', 18 and 18' and the electrically-conductive beam 20, ruthenium metal is preferred for these elements of the NEM switch 10 since ruthenium can be oxidized to form a ruthenium oxide passivation layer which is electrically conducting and which does not form a friction polymer after repeated cycling of the NEM switch 10. The ruthenium metal layer 28 can be, for example, 200 nm thick.

Although not shown in FIG. 7B, deposition of the ruthenium metal layer 28 can be preceded by deposition of a thin (e.g. 10-20 nm) layer of titanium to improve adhesion of the ruthenium metal layer 28.

Figure 7C:

In FIG. 7C, a layer 36 of silicon dioxide can be blanket deposited over the substrate 12 by PECVD. The silicon dioxide layer 36 can be, for example, 100 nm thick.

Figure 7D:
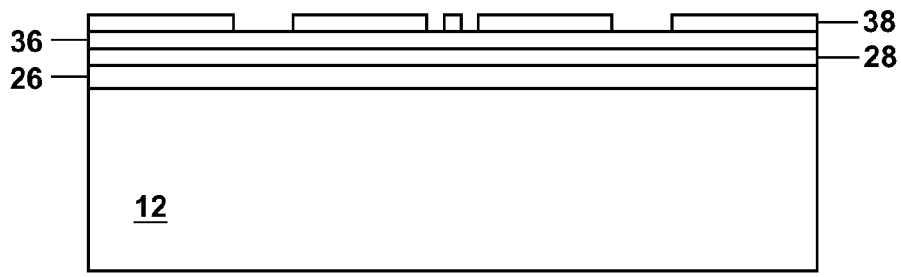

In FIG. 7D, a layer 38 of a photoresist can be spun on over the substrate 12. The photoresist can be photolithographically exposed using a conventional high-resolution stepper when MEM switches 10 are being formed with feature sizes which are compatible with the high resolution stepper. Alternately, an electron-beam resist can be spun on over the substrate 12 to form the resist layer 38 which can then be exposed using a direct-write electron-beam lithography system to provide feature sizes as small as 10-15 nm.

The electron-beam resist can comprise a chain scission resist consisting of copolymers of α-chloromethacrylate and α-methylstyrene which can be thinned with anisole (i.e. methoxybenzene) prior to spinning the resist onto the substrate 12 at 5000 rpm for one minute to form the layer 38 which can be on the order of 100 nm thick. After spinning, the electron-beam resist layer 38 can be baked at 170° C. for 3 minutes to dry the resist. Exposure of the electron-beam resist layer 38 can then be performed using the direct-write electron-beam lithography system with a beam energy of, for example, 100 kV and an exposure dose of 400 $\mu C \cdot cm^{-2}$. The electron-beam resist layer 38 can then be developed in n-Amyl acetate for 1 minute followed by rinsing in isopropyl alcohol and drying with nitrogen. This forms a mask pattern in the layer 38 which can be transferred to the underlying silicon dioxide layer 36 which can then be used as a hard mask to define the shapes of the electrodes 14, 16, 16', 18 and 18' and the electrically-conductive beam 20 in the metal layer 28 by an anisotropic dry etching process step.

Figure 7E:
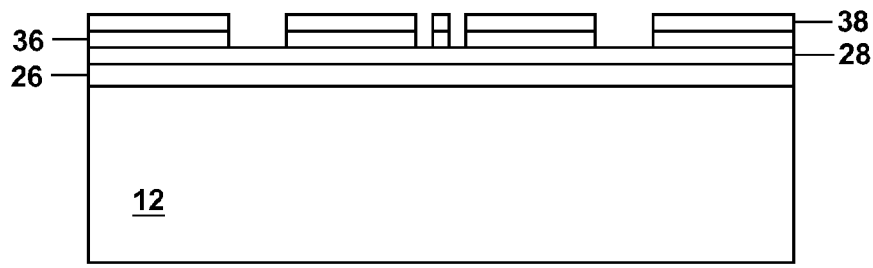

To improve the etch resistance of the mask formed from the electron-beam resist layer 38 described above, the layer 38 can be hardened by heating and by exposure to ultraviolet (UV) radiation. The heating can be performed, for example, by using a hot plate at a temperature of 90-110° C. for several minutes. The exposure to UV radiation can be performed, for example, for up to about 30 minutes using a lamp providing an average power of about 8 $mW \cdot cm^{-2}$ at a wavelength of 248 nm. The heating and UV exposure of the resist layer 38 produce changes in the electron-beam resist, which can be detected using infrared spectroscopy of the layer 38. Hardening of the electron-beam resist layer 38 increases the etch resistance of the layer 38 to anisotropic dry etching with a plasma (e.g. a $CF_4/O_2$ plasma) which is used to transfer the mask pattern from the electron-beam resist layer 38 to the underlying silicon dioxide layer 36 as shown FIG. 7E. This anisotropic dry etching step can be performed by reactive ion etching (RIE), or by using a high-density plasma (HDP). After patterning of the silicon dioxide layer 36 as shown in FIG. 7E, the electron-beam resist layer 38 can be removed to leave the patterned silicon dioxide layer 36 in place for use in patterning the underlying metal layer 28.

Figure 7F:
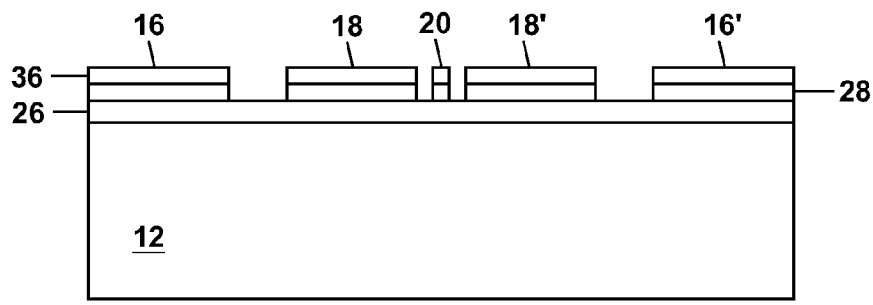

In FIG. 7F, the mask pattern from the overlying silicon dioxide hard mask (i.e. patterned layer 36) can be etched into the metal layer 28 using another anisotropic dry etching step (e.g. by RIE or HDP using a $Cl_2/O_2$ plasma). This defines the shapes of the electrodes 14, 16, 16', 18, 18' and the electrically-conductive beam 20 which are formed from the metal layer 28.

Figure 7G:
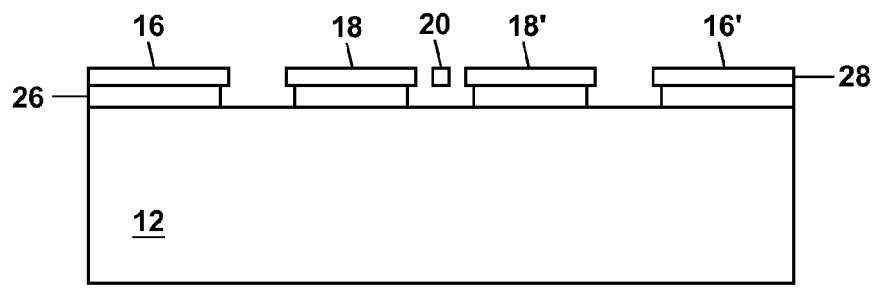

In FIG. 7G, the silicon dioxide layer 36 can then be removed by a selective wet etching step using an etchant comprising hydrofluoric acid (HF). The HF etchant is an isotropic etchant which selectively etches away the silicon dioxide without substantially chemically attacking the silicon substrate 12 or the metal layer 28. This selective etching step also undercuts the electrically-conductive beam 20, thereby releasing the beam 20 for movement with the beam being supported at each end thereof by the remainder of the source electrode 14.

Figure 7H:
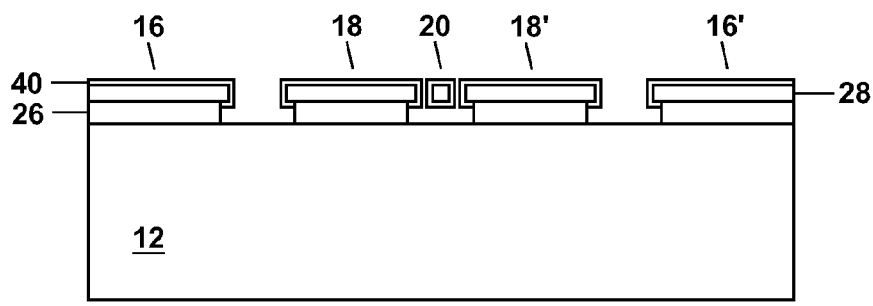

In FIG. 7H, when ruthenium is used for the metal layer 28, an exposed portion of the ruthenium metal layer 28 can be optionally oxidized by heating to an elevated temperature (e.g. 420° C.) for sufficient time (e.g. 10-120 minutes) to form a ruthenium oxide passivation layer 40 which is a few nanometers (e.g. 2-10 nm) thick over the electrodes 14, 16, 16', 18, 18' and over the electrically-conductive beam 20. This ruthenium oxide passivation layer 40 is advantageous since it is electrically conductive and can improve reliability of the NEM switch 10 by suppressing the formation of carbon (i.e. nanocrystalline graphite) on contacting surfaces of the drain electrodes 16 and 16' and the electrically-conductive beam 20 with repeated operation.

Another method which can be used to form the NEM switch 10 of the present invention is to use focused ion beam milling to directly pattern the electrodes 14, 16, 16', 18, 18' and the electrically-conductive beam 20 in the metal layer 28.

Figure 8:
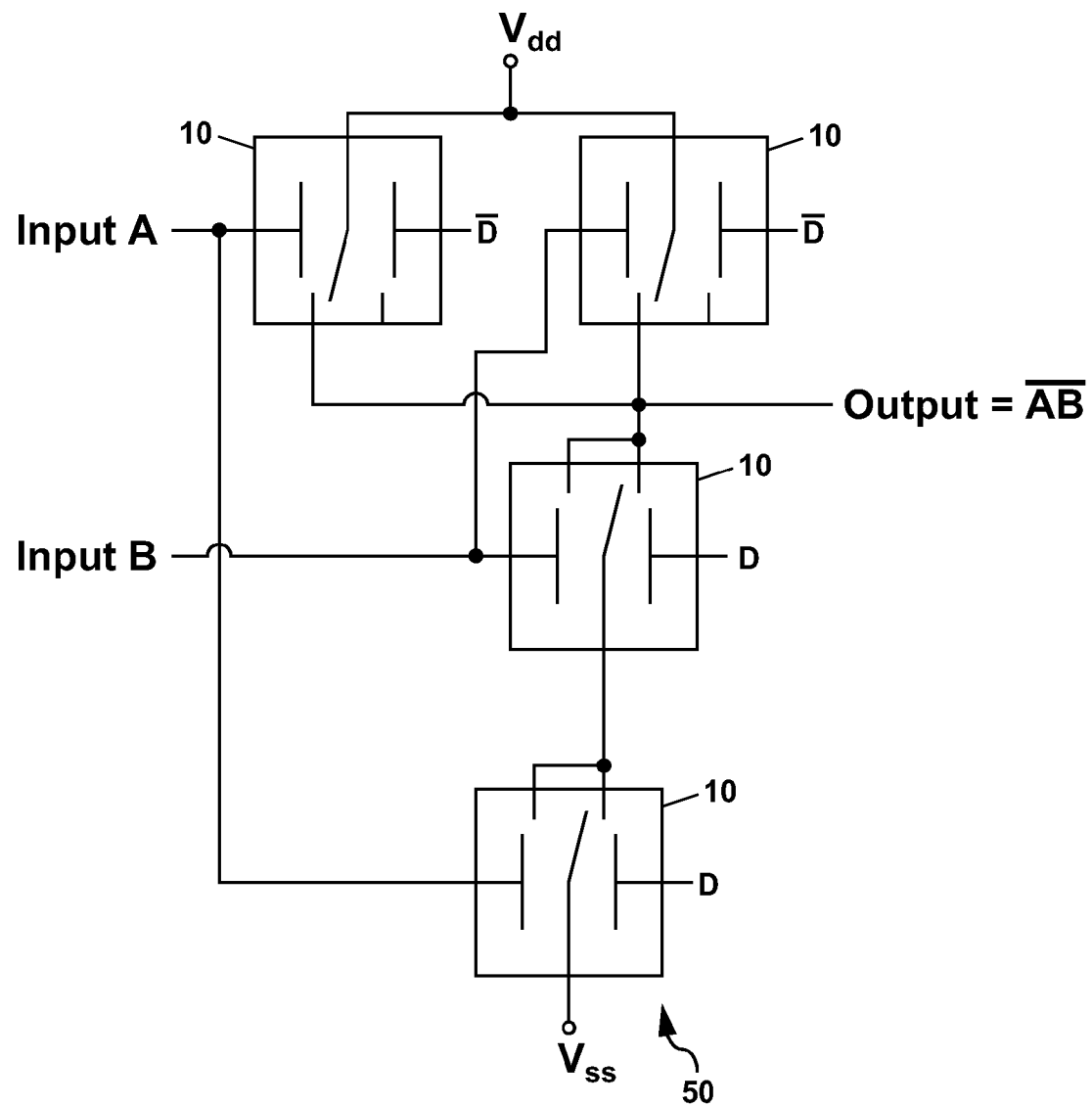
FIG. 8 shows a schematic diagram for an example of a NAND gate formed by interconnecting a plurality of the NEM switches of the present invention.
Figure 9:
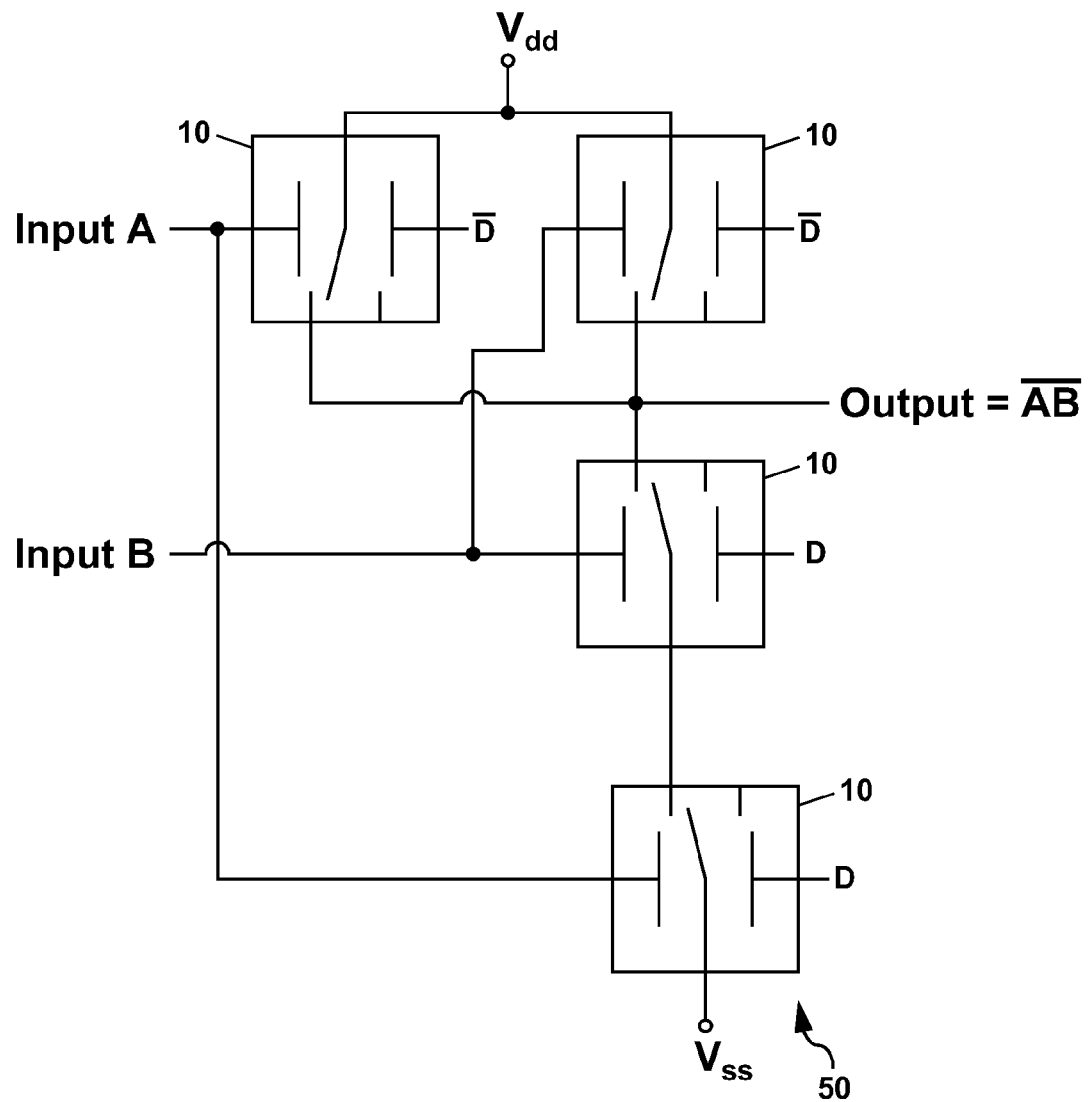
FIG. 9 shows an alternative interconnection arrangement for the NAND gate according to the present invention.
Figure 10:
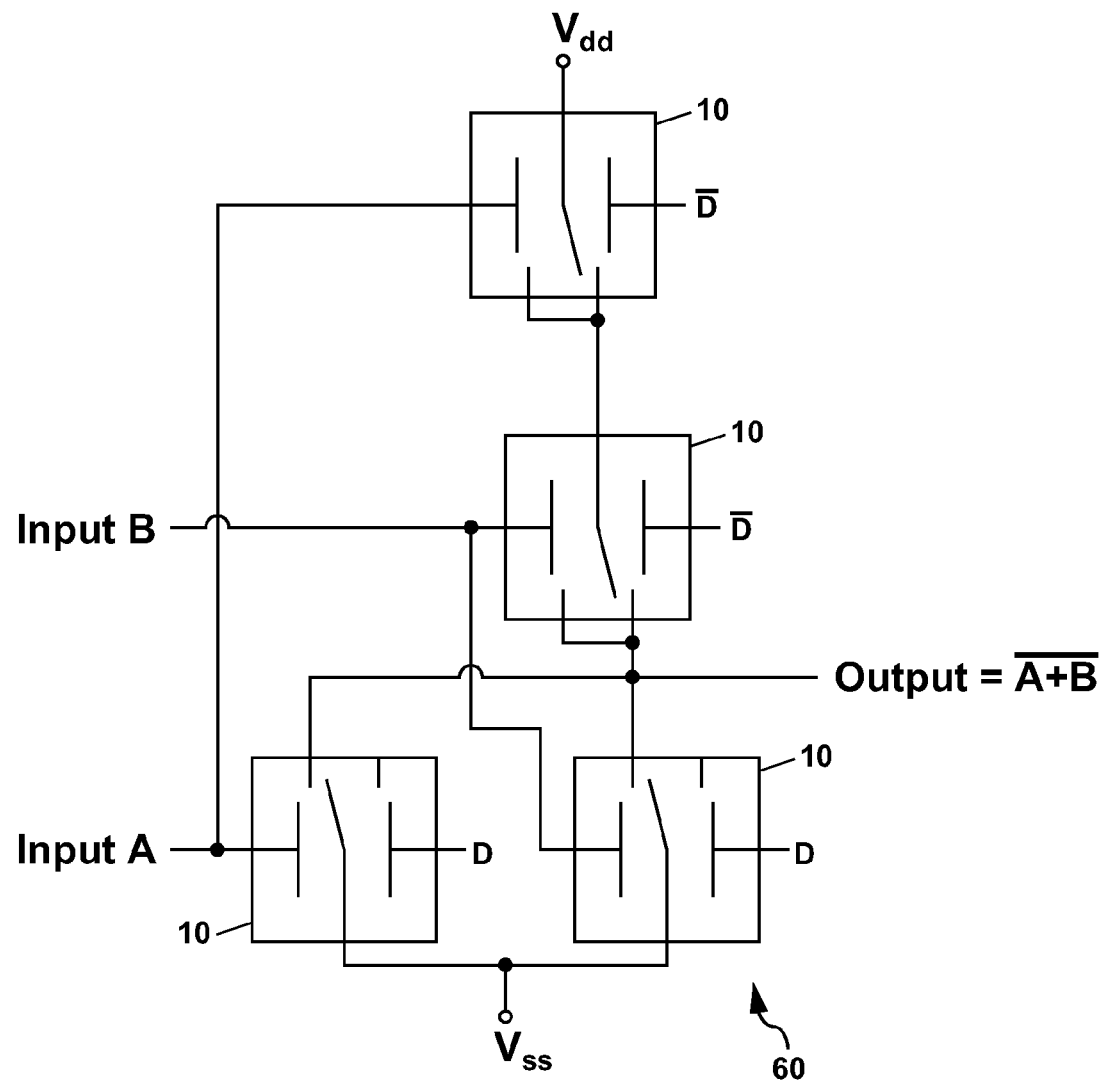
FIG. 10 shows a schematic diagram for an example of a NOR gate formed by interconnecting a plurality of the NEM switches of the present invention.
Figure 11:
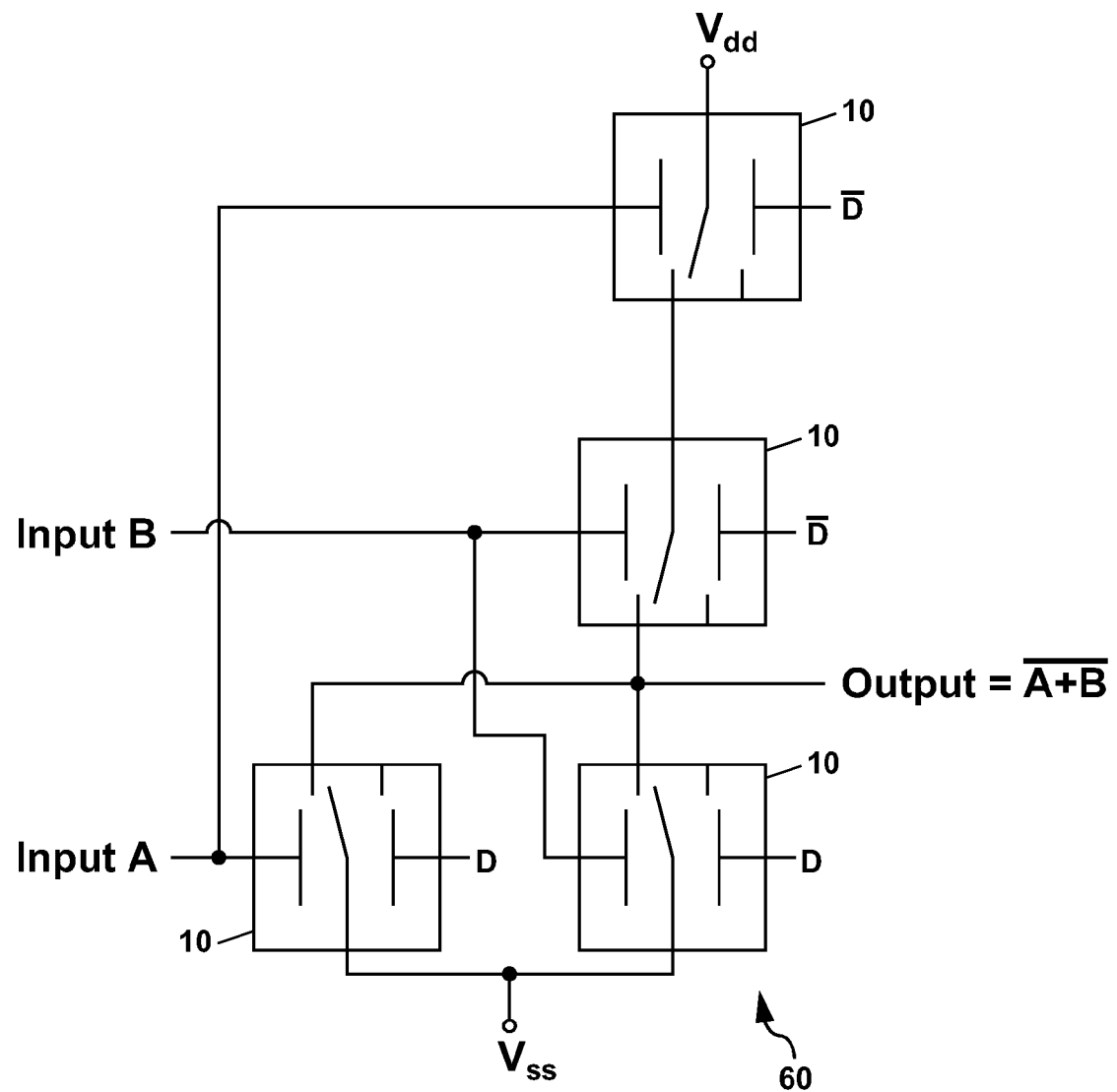
FIG. 11 shows an alternative interconnection arrangement for the NOR gate according to the present invention.
Figure 13:
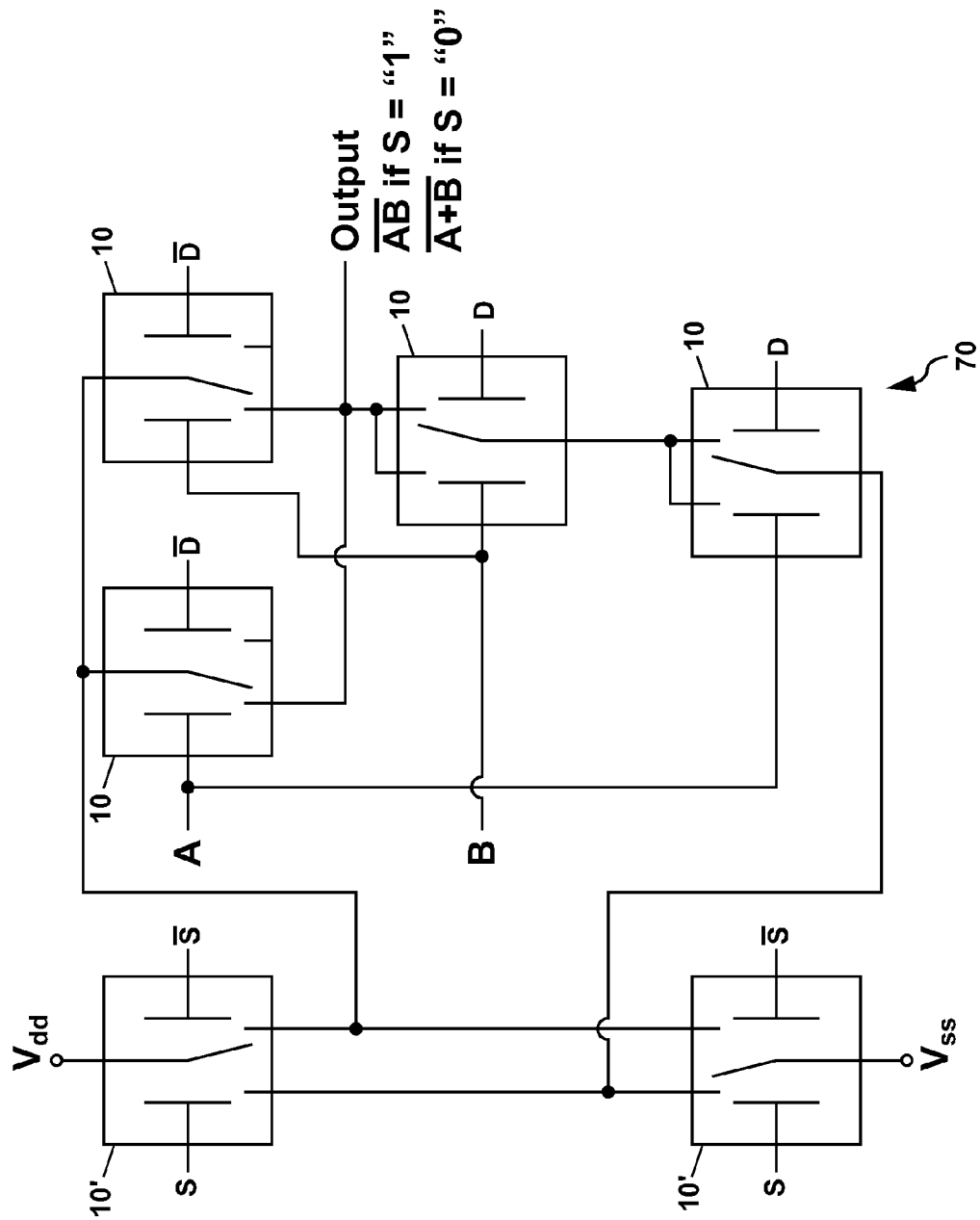
FIG. 13 shows a schematic diagram for a programmable logic gate of the present invention which can be switched between being a NAND gate and being a NOR gate.
Figure 14:
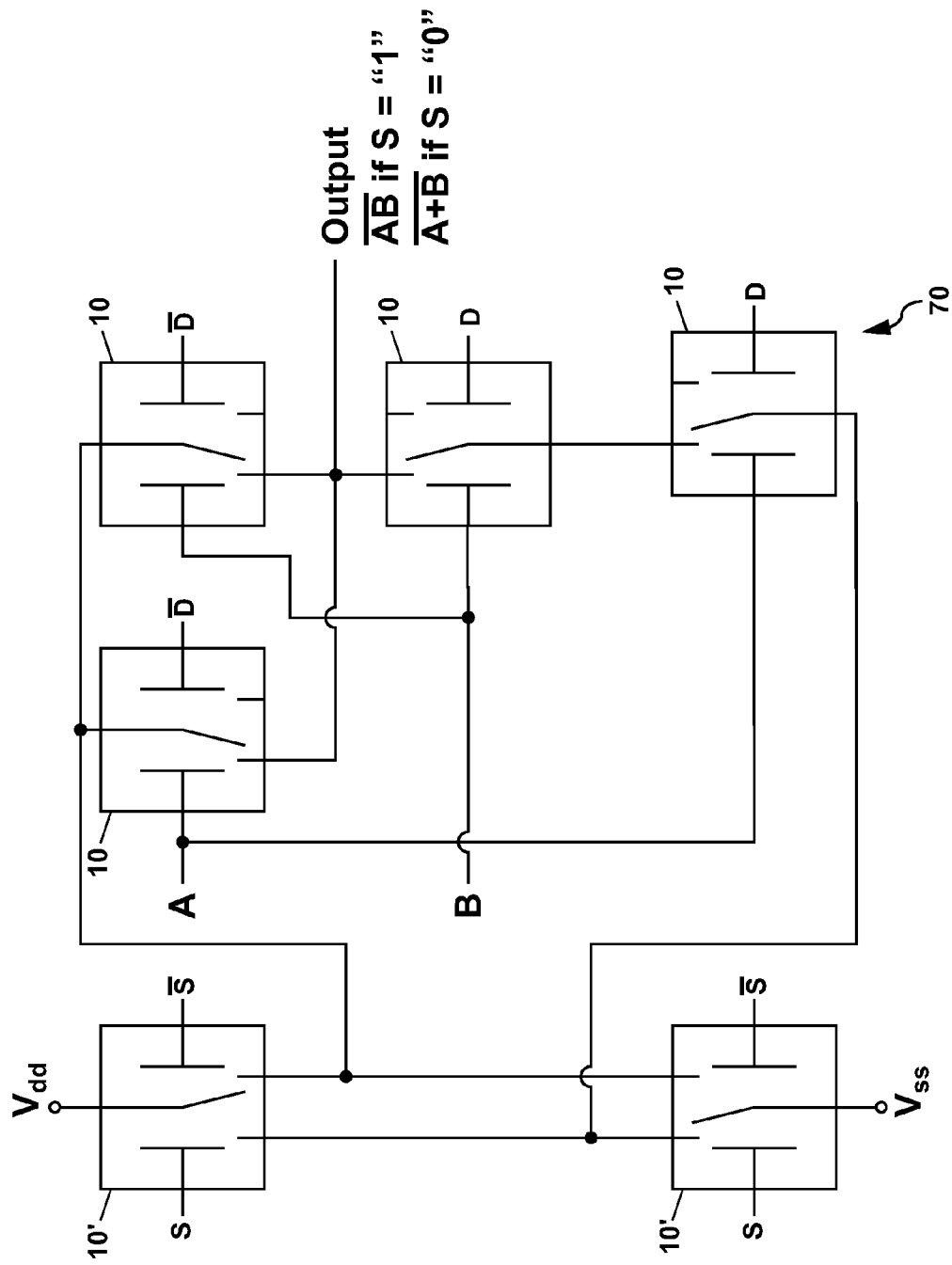
FIG. 14 shows an alternative interconnection arrangement for the programmable logic gate of FIG. 13.
Figure 15:
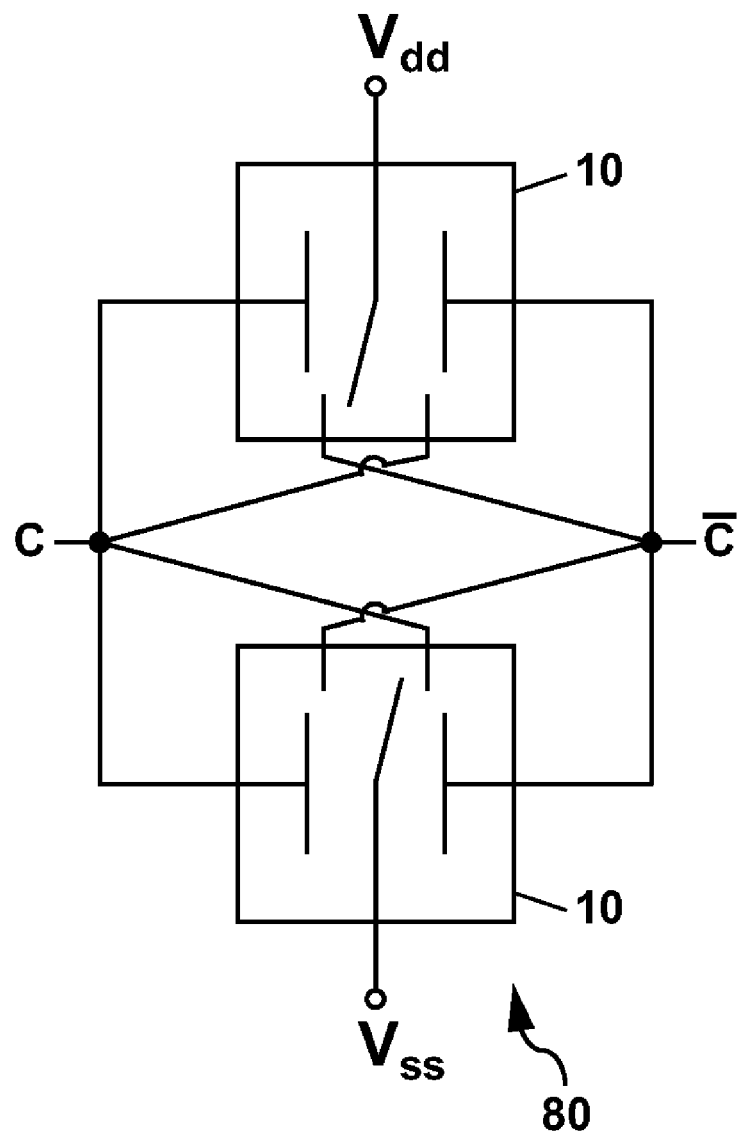
FIG. 15 shows a schematic diagram of a cross-coupled data latch which can be formed by interconnecting a pair of the NEM switches of the present invention.
Figure 16:
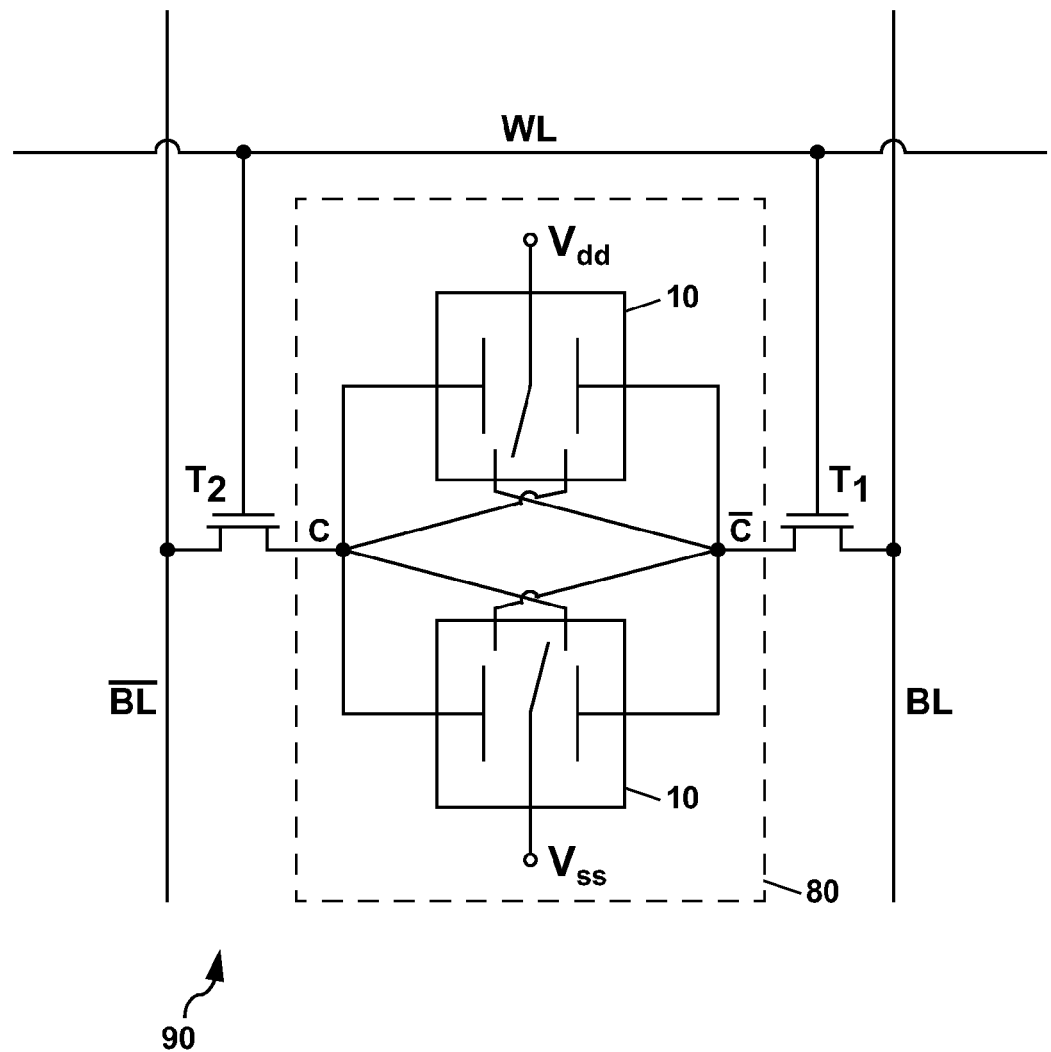
FIG. 16 shows a schematic diagram of a SRAM memory cell formed using the cross-coupled data latch of FIG. 15.
Figure 17:
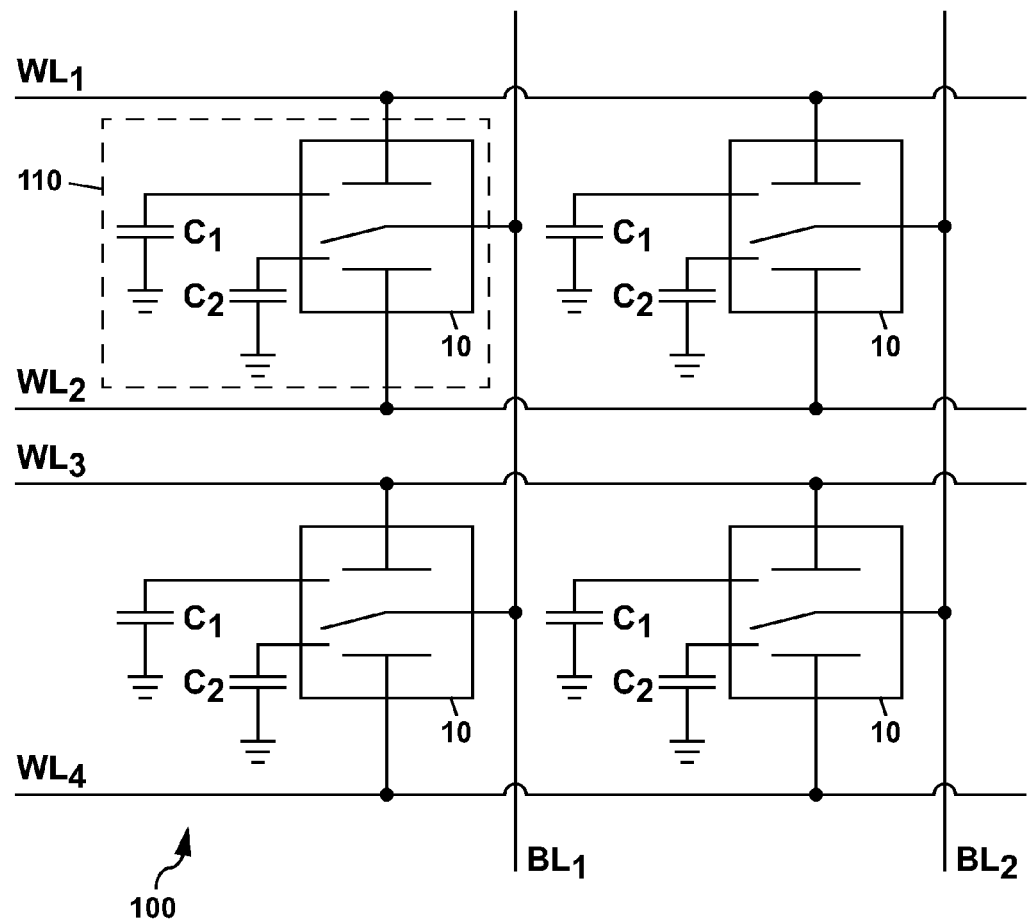
FIG. 17 shows a schematic diagram of a DRAM memory cell array formed according to the present invention. Each DRAM memory cell in the array stores two bits of information which can be independently addressed.

When used to form a digital logic circuit, the lateral dimensions of the NEM switch 10 of the present invention can be about the same as the length of the electrically-conductive beam 20 which can be, for example, in a range of 1-10 μm. Various types of digital logic circuits can be formed from a plurality of interconnected NEM switches 10 as will be described hereinafter. FIGS. 8 and 9 show examples of NAND gates 50 formed using a plurality of the NEM switches 10. FIGS. 10 and 11 show examples of NOR gates 60 formed from a plurality of interconnected NEM switches 10. FIGS. 13 and 14 show examples of programmable logic gates 70 formed with the NEM switches 10 of the present invention. These programmable logic gates 70 can be switched between being NAND gates and being NOR gates, as needed. FIG. 15 shows an example of a cross-coupled data latch 80 using two NEM switches 10 which has applications for forming a SRAM memory cell 90 as shown in FIG. 16. FIG. 17 shows an example of a DRAM memory cell array 100 according to the present invention which comprises a plurality of DRAM memory cells 110 each formed from a single NEM switch 10 and storing two bits of information that can be independently accessed.

Those skilled in the art will understand from the examples of logic circuits provided hereinafter that the NEM switch 10 of the present invention has application for forming any type of digital logic circuit known to the art. Those skilled in the art will also understand from the examples presented hereinafter that the NEM switch 10 of the present invention can be used as a substitute for conventional CMOS transistors in forming digital logic circuits, or can be used in combination with conventional CMOS transistors.

FIG. 8 shows a first example of a NAND gate 50 which can be formed using a plurality of NEM switches 10 of the present invention. In the NAND gate 50 of FIG. 8, two logic state inputs A and B are used to generate a NAND (i.e. a Not AND) logic function output which is denoted as $\overline{AB}$. The logic state inputs A and B are provided to one pair of gate electrodes 18 or 18' of each NEM switch 10, with the other pair of gate electrodes 18' or 18 of each NEM switch 10 being connected to a disable input D or $\overline{D}$ as shown in FIG. 8. The disable input $\overline{D}$ is the complement of D so that when the logic state of D is "1", then the logic state of $\overline{D}$ is "0"; and when the logic state of D is "0", then the logic state of $\overline{D}$ is "1". The disable inputs D and $\overline{D}$ can be formed, for example, from a single logic state signal using an inverter or a cross-coupled data latch (see FIG. 15). The voltage required for the disable inputs can be the same or different from the voltage required for the logic state inputs A and B.

The disable inputs D and $\overline{D}$ are simultaneously applied to each NEM switch 10 in the NAND gate 50 and can either disable the NAND gate 50 from being responsive to the A and B inputs or enable the NAND gate 50 to be responsive to the A and B inputs to produce the NAND function output $\overline{AB}$, depending upon the logic states of the disable inputs D and $\overline{D}$. To disable the NAND gate 50, the disable inputs D and $\overline{D}$ should be provided prior to the A and B inputs. This allows the disable inputs D and $\overline{D}$ to bow the electrically-conductive beam 20 of each NEM switch 10 away from a side of the NEM switch 10 where the A or B input will be applied, thereby increasing the gap 24 on the side of the NEM switch 10 where the A or B input is applied to disable that NEM switch 10 from being responsive to the A or B input (see FIG. 4). In the disabled state, the A or B input will not be able to overcome the much larger electrostatic force of attraction which keeps the beam 20 bowed towards the side of the NEM switch 10 where the disable input D or $\overline{D}$ is applied until the disable input D or $\overline{D}$ is removed or switched to the opposite logic state. In the disabled state, each NEM switch 10 will also form an electrical connection between the source electrode 14 and the drain electrode 16 or 16' on the side of the NEM switch 10 where the disable input D or $\overline{D}$ is applied. This can be useful to set the output of the NAND gate 50 to a predetermined logic state.

In the first example of the NAND gate 50 in FIG. 8, when each disable input D is in a logical "1" state (e.g. a state corresponding to the power supply voltage $V_{dd}$) and each disable input $\overline{D}$ is in a logical "0" state (e.g. a state corresponding to the power supply voltage $V_{ss}$ which can be at ground electrical potential), then the NEM switches 10 in FIG. 8 which receive the disable inputs D will be activated to urge the electrically-conductive beams 20 therein towards the gate electrodes which are receiving the disable inputs D; and the NEM switches 10 which receive the disable inputs $\overline{D}$ will also be activated to urge the beams 20 therein towards the gate electrodes which are receiving the disable inputs $\overline{D}$. This will render all of the NEM switches 10 in the NAND gate 50 unresponsive to the A and B inputs. This will also connect the output of the NAND gate 50 to the power supply voltage $V_{ss}$, thereby providing a "0" logic state output for the NAND gate 50. With the disable inputs D and $\overline{D}$ overriding the input signals A and B and fixing the output of the NAND gate 50, the dynamic power consumption of this digital logic circuit and any following circuits is minimized.

When the disable input D is switched to the logical "0" state and the disable input $\overline{D}$ is in the logical "1" state, then the D and $\overline{D}$ inputs will have no effect on the NEM switches 10 since there will be no voltage difference between the D and $\overline{D}$ inputs and the electrically-conductive beams 20 to generate an electrostatic force of attraction to move the beams 20. This will allow the NAND gate 50 to be responsive to the A and B inputs to provide the NAND function output $\overline{AB}$ as shown in the NAND truth table of FIG. 12A. Those skilled in the art will understand that the NAND gate 50 of FIG. 8 is a universal gate that can be used as a building block to form any type of digital logic gate.

FIG. 9 shows a schematic diagram of an alternative configuration of the NAND gate 50 of the present invention. In this second example of the NAND gate 50, the output of the NAND gate 50 will be electrically floating (i.e. disconnected from the inputs A and B, and also disconnected from the power supply voltages $V_{ss}$ and $V_{dd}$) and unresponsive to the logic states of the A and B inputs when each disable input D is in the logical "1" state, and each disable input $\overline{D}$ is in the logical "0" state. In the disabled state, the dynamic power consumption of the NAND gate 50 and any other logic gates connected to the output of the NAND gate 50 will be minimized. When each disable input D is switched to the logical "0" state and each disable input $\overline{D}$ is switched to the logical "1" state, then the NAND gate 50 will be responsive to the A and B logic state inputs to provide the NAND function output $\overline{AB}$ according to the NAND truth table in FIG. 12A.

FIG. 10 shows a schematic diagram of a first example of a NOR gate 60 which can be formed from a plurality of the NEM switches 10 of the present invention. In the NOR gate 60 of FIG. 10, the logic state inputs A and B are used to provide a NOR (i.e. a Not OR) logic function output denoted as $\overline{A+B}$. The logic state inputs A and B are provided to one pair of gate electrodes 18 or 18' of each NEM switch 10. The other pair of gate electrodes 18' or 18 can be connected to the disable inputs D and $\overline{D}$ as shown in FIG. 10. As with the NAND gates 50 previously described with reference to FIGS. 8 and 9, the disable inputs D and $\overline{D}$ in the example of FIG. 10 can be used to control the NOR gate 60 so that it is either in a disabled state and not responsive to the A and B logic state inputs, or so that it is in an enabled state and responsive to the A and B inputs to generate the NOR function output $\overline{A+B}$. In the disabled state, the dynamic power consumption of the NOR gate 60 and any other logic gates connected to the output of the NOR gate 60 will be minimized.

In the example of FIG. 10, the disabled state will occur when each disable input D is in the logical "1" state, and each disable input $\overline{D}$ is in the logical "0" state prior to the A and B inputs being applied. In the disabled state, the NOR gate 60 will be unresponsive to the A and B inputs; and the output of the NOR gate 60 will be in a logical "1" state (i.e. connected to $V_{dd}$). The enabled state can occur when the disable inputs D are switched to the logical "0" state, and the disable inputs $\overline{D}$ are switched to the logical "1" state. In the enabled condition, the NOR function output $\overline{A+B}$ will be determined by the inputs A and B according to the NOR truth table in FIG. 12B.

The NOR gate 60 of the present invention can also be configured as shown in FIG. 11, with the output of the NOR gate 60 set to be electrically floating when the NOR gate 60 is in the disabled state with D in the "1" state and $\overline{D}$ in the "0" state prior to applying the inputs A and B. This second example of the NOR gate 60 can be switched to the enabled state to provide a NOR function output $\overline{A+B}$ defined by the inputs A and B by switching the disable inputs D to the logical "0" state, with the disable inputs $\overline{D}$ being switched to the logical "1" state.

Those skilled in the art will understand that other configurations are possible for the NAND gate 50 and the NOR gate 60 of the present invention. For example, the NAND gate 50 and the NOR gate 60 of the present invention can be configured for operation with three or more logic state inputs.

FIG. 13 shows an example of a programmable logic gate 70 (i.e. a circuit 70) which can be formed by using a plurality of the NEM switches 10 of the present invention. The programmable logic gate 70 in FIG. 13 can be used to switch between different types of logic functions. In this example, the different types of logic functions are a NAND function and a NOR function depending on whether the gate 70 is configured as a NAND gate or as a NOR gate. Switching between these two logic functions can be performed using switching inputs S and $\overline{S}$ which reconfigure electrical connections to $V_{dd}$ and $V_{ss}$ using the two NEM switches 10' on the left-hand side of FIG. 13. With the switching input S in a logical "1" state and with $\overline{S}$ in a logical "0" state, the programmable logic gate 70 functions as a NAND gate with the power supply connections being as shown in FIG. 8.

It should be noted that the voltages required for the switching inputs S and $\overline{S}$ can be the same or different from the voltages required for the logic state inputs A and B. Additionally, the voltages required for the disable inputs D and $\overline{D}$ can be the same or different from the voltages required for the logic state inputs A and B.

When functioning as a NAND gate, the circuit 70 can either provide a NAND function output $\overline{AB}$ using the A and B logic state inputs, or can be disabled to provide an output which is in the logical "0" state (i.e. connected to $V_{ss}$) depending upon the disable inputs D and $\overline{D}$ as previously described with reference to FIG. 8. With the switching inputs reversed so that S is in a logical "0" state and $\overline{S}$ is in a logical "1" state, the programmable logic gate 70 is connected to function as a NOR gate with the power supply connections being as shown in FIG. 10. When functioning as a NOR gate, the circuit 70 can either provide a NOR function output $\overline{A+B}$ using the A and B logic state inputs, or can be disabled to provide an output which is in the logical "1" state (i.e. connected to $V_{dd}$) depending upon the disable inputs D and $\overline{D}$ as previously described with reference to FIG. 10.

An alternative configuration for the programmable logic gate 70 of the present invention is shown in FIG. 14. In this configuration, the programmable logic gate 70 can function as either a NAND gate or a NOR gate depending upon the logic state of the switching inputs S and $\overline{S}$ when the circuit 70 is in an enabled state, and will provide an output which is electrically floating when the circuit 70 is in a disabled state regardless of the logic state of the switching inputs S and $\overline{S}$. In each of the above examples of the programmable logic gate 70 of the present invention, switching the circuit 70 to the disabled state will minimize its dynamic power consumption as well as the dynamic power consumption of any other gates connected to the output of the circuit 70.

The type of reconfigurability demonstrated with the programmable logic gate 70 in the examples of FIGS. 13 and 14 is not possible using conventional CMOS circuitry which requires NMOS and PMOS transistors which function differently from each other. In conventional CMOS circuitry, only NMOS transistors can be used as pull-down devices, and only PMOS transistors can be used as pull-up devices. The NEM switches 10 of the present invention can function as either pull-up devices or pull-down devices. This can reduce the number of NEM switches 10 needed for a particular circuit compared to the number of CMOS transistors in an equivalent CMOS circuit. It can also provide unique capabilities such as switching power supply connections in a circuit as described previously with reference to FIGS. 13 and 14. The NEM switches 10 of the present invention can also be formed with two drain electrodes 16 and 16' and two pairs of gate electrodes 18 and 18'; whereas conventional CMOS transistors contain only a single drain electrode and a single gate electrode. This provides for different modes of operation of the NEM switches 10, including disabling of the NEM switches 10, as needed, and programming of the NEM switches 10 to perform different functions at different times.

The NEMS switch 10 of the present invention also has applications to forming memory devices. FIG. 15 shows an example of a cross-coupled data latch 80 which can be used to form a static random access memory (SRAM) cell 90 as shown in FIG. 16. The data latch 80 in FIG. 15 comprises a pair of interconnected NEM switches 10 which replaces four CMOS transistors in an equivalent CMOS data latch (not shown). The data latch 80 in FIG. 15 operates in a push-pull fashion to store a logic state C and its complement $\overline{C}$ with a near-zero static power consumption because of the extremely low leakage current of the NEM switches 10.

The cross-coupled data latch 80 of FIG. 15 can be used as a core for the SRAM memory cell 90 in FIG. 16. This example of the SRAM memory cell 90 utilizes two CMOS access transistors $T_1$ and $T_2$ which can be used to write the logic states C and $\overline{C}$ into the data latch 80, and to read out the logic states C and $\overline{C}$ therefrom. The access transistors $T_1$ and $T_2$ can be formed on the same substrate 12 as the NEM switches 10 prior to forming the NEM switches 10. In other embodiments of the present invention, the access transistors $T_1$ and $T_2$ can be replaced by NEM switches 10. An array of up to millions or more of individual SRAM memory cells 90 can be formed on a common substrate 12 for storing information which can be used with integrated circuitry formed from CMOS transistors, NEM switches 10 or a combination thereof.

Access to the SRAM memory cell 90 in FIG. 15 is controlled by a word line WL which controls the access transistors $T_1$ and $T_2$ and connects the data latch 80 to the bit lines BL and $\overline{BL}$ to read a logic state from the SRAM memory cell 90, or to write a logic state therein. When the word line WL is not asserted, the transistors $T_1$ and $T_2$ are in an "off" state which disconnects the data latch 80 from the bit lines BL and $\overline{BL}$, with the data latch 80 retaining a stored logic state therein as long as the data latch 80 receives electrical power.

To write data into the SRAM memory cell 90, the bit line BL can be charged with a particular logic state and the bit line $\overline{BL}$ can be charged with the complement of that particular logic state. The word line WL can then be set high (i.e. to a "1" state) to write that particular logic state and its complement into the data latch 80. To read out data from the SRAM memory cell 90, the bit lines BL and $\overline{BL}$ can both be charged with a "1" logic state, and the word line WL can be set high to transfer the logic state from the data latch 80 onto the bit lines BL and $\overline{BL}$.

Other types of memory cells can also be formed using the NEM switch 10 of the present invention. FIG. 17 shows an example of a dynamic random access memory (DRAM) array 100 which can be formed according to the present invention using a plurality of DRAM memory cells 110 which each include a NEM switch 10 and two storage capacitors $C_1$ and $C_2$. The storage capacitors $C_1$ and $C_2$ are connected to different drain electrodes 16 and 16' of each NEM switch 10 to allow independently addressing of the capacitors using a pair of word lines (e.g. $WL_1$ and $WL_2$) connected to the gate electrodes 18 and 18' for a row of NEM switches 10 in the DRAM memory array 100. Thus, each DRAM memory cell 110 is capable of storing two bits of information. Each storage capacitor $C_1$ and $C_2$ can be accessed using the word lines WL and bit lines BL and $\overline{BL}$ for reading or writing logic states into each DRAM memory cell 110 of the array 100, or for periodically refreshing each memory cell 110. The retention time for the DRAM memory cells 110 of the present invention is expected to be much longer than that of conventional CMOS DRAM memory cells due to the much smaller leakage current of the NEM switches 10.

Those skilled in the art will understand that virtually any type of digital logic circuit known to the art can be formed using the NEM switches 10 and digital logic circuits of the present invention. Additionally, those skilled in the art will understand that the NEM switches 10 and digital logic circuits of the present invention can be used in combination with conventional CMOS transistors formed on the same substrate 12. The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A nanoelectromechanical (NEM) switching device, comprising:
    a substrate;
    a source electrode comprising an electrically-conductive beam which is suspended above the substrate and anchored at each end thereof to the substrate;
    a drain electrode located on the substrate proximate to a midpoint of the electrically-conductive beam on one side thereof, with the drain electrode being separated from the electrically-conductive beam by a first gap; and
    a pair of gate electrodes which are electrically connected together and located on the substrate on the same side of the electrically-conductive beam as the drain electrode, with the pair of gate electrodes being separated from the electrically-conductive beam by a second gap which is larger than the first gap, and with each gate electrode of the pair of gate electrodes being located adjacent to the drain electrode on a different side thereof, and with the pair of gate electrodes, in response to an actuation voltage applied between the pair of gate electrodes and the source electrode, urging the electrically-conductive beam to bow towards the drain electrode in a direction substantially parallel to the substrate to form an electrical connection between the source electrode and the drain electrode.

2. The apparatus of claim 1 further comprising another pair of gate electrodes which are electrically connected together and located on the substrate on a side of the electrically-conductive beam opposite the drain electrode.

3. The apparatus of claim 2 further comprising another drain electrode, with the two drain electrodes being located opposite each other on different sides of the electrically-conductive beam.

4. The apparatus of claim 1 wherein the substrate comprises silicon.

5. The apparatus of claim 1 wherein the electrically-conductive beam has a length of $\leq 10$ microns and a width of $\leq 0.1$ microns.

6. The apparatus of claim 1 wherein the electrically-conductive beam comprises ruthenium metal.

7. The apparatus of claim 6 wherein the electrically-conductive beam further comprises a ruthenium oxide coating formed over at least a portion of the ruthenium metal.

8. A nanoelectromechanical (NEM) switching device, comprising:
    a substrate;
    a source electrode comprising an electrically-conductive beam which is suspended above the substrate and anchored at each end thereof to the substrate;
    a pair of drain electrodes located on the substrate proximate to a midpoint of the electrically-conductive beam, with each drain electrode being located on a different side of the electrically-conductive beam and being separated therefrom by a first gap; and
    two pairs of gate electrodes located on the substrate on different sides of the electrically-conductive beam and separated therefrom by a second gap which is larger than the first gap, and with each pair of gate electrodes, in response to a gate voltage applied thereto, urging the electrically-conductive beam to bow towards that pair of gate electrodes to form an electrical connection between the source electrode and the drain electrode which is located between that pair of gate electrodes.

9. The apparatus of claim 8 wherein the substrate comprises a semiconductor substrate.

10. The apparatus of claim 8 wherein the electrically-conductive beam has a length of $\leq 10$ microns and a width of $\leq 0.1$ microns.

11. The apparatus of claim 8 wherein the electrically-conductive beam comprises ruthenium metal.

12. The apparatus of claim 11 wherein the electrically-conductive beam further comprises a ruthenium oxide coating over at least a portion of the ruthenium metal.

13. The apparatus of claim 8 wherein the second gap on one side of the electrically-conductive beam is different from the second gap on the other side of the electrically-conductive beam so that the gate voltage required to form the electrical connection between the source electrode and a first drain electrode of the pair of drain electrodes is different from the gate voltage required to form the electrical connection between the source electrode and a second drain electrode of the pair of drain electrodes.

14. A digital logic circuit, comprising:
a plurality of interconnected nanoelectromechanical (NEM) switching devices, with each NEM switching device further comprising:
a substrate;
a source electrode having an electrically-conductive beam which is suspended above the substrate and anchored at each end thereof to the substrate;
a pair of drain electrodes located on the substrate on opposite sides of the electrically-conductive beam, with each drain electrode being oriented substantially perpendicular to the electrically-conductive beam near a midpoint thereof and being separated from the electrically-conductive beam by a first gap; and
two pairs of gate electrodes located on the substrate, with each pair of gate electrodes being located on a different side of the electrically-conductive beam and being separated therefrom by a second gap which is larger than the first gap, and with each pair of gate electrodes at least partially surrounding one of the drain electrodes, and with each pair of gate electrodes, in response to a voltage applied between that pair of gate electrodes and the source electrode, urging the electrically-conductive beam to bow towards that pair of gate electrodes to form an electrical connection between the source electrode and the drain electrode which is at least partially surrounded by that pair of gate electrodes.

15. The apparatus of claim 14 wherein the voltage provided to one of the two pairs of gate electrodes in each NEM switching device provides a logic state input to that NEM switching device.

16. The apparatus of claim 15 wherein the voltage provided to the other of the two pairs of gate electrodes in each NEM switching device provides a disable input to that NEM switching device, thereby rendering that NEM switching device unresponsive to the logic state input.

17. The apparatus of claim 16 wherein the voltage for the logic state input is the same as the voltage for the disable input.

18. The apparatus of claim 16 wherein the voltage for the logic state input is different from the voltage for the disable input.

19. The apparatus of claim 14 wherein the digital logic circuit includes at least one NAND gate formed from the plurality of interconnected NEM switching devices.

20. The apparatus of claim 19 wherein each NAND gate has a plurality of logic state inputs and a plurality of disable inputs to provide an output which is determined by a NAND function of the logic state inputs when the disable inputs are in a first logic state, with the output being electrically floating or tied to a power supply voltage when the disable inputs are in a second logic state.

21. The apparatus of claim 14 wherein the digital logic circuit includes at least one NOR gate formed from the plurality of interconnected NEM switching devices.

22. The apparatus of claim 21 wherein each NOR gate has a plurality of logic state inputs and a plurality of disable inputs to provide an output which is determined by a NOR function of the logic state inputs when the disable inputs are in a first logic state, with the output being electrically floating or tied to a power supply voltage when the disable inputs are in a second logic state.

23. The apparatus of claim 14 wherein the digital logic circuit includes a programmable logic gate which can be switched between different types of logic functions using a pair of the NEM switching devices to switch power supply connections to the programmable logic gate.

24. The apparatus of claim 14 wherein the digital logic circuit includes at least one SRAM memory cell which is formed, at least in part, from the plurality of interconnected NEM switching devices.

25. The apparatus of claim 14 wherein the digital logic circuit includes at least one cross-coupled data latch formed from the plurality of interconnected NEM switching devices.

26. The apparatus of claim 14 wherein the digital logic circuit includes a plurality of DRAM memory cells formed from the plurality of interconnected NEM switching devices, with each DRAM memory cell comprising two storage capacitors which are electrically connected to one of the NEM switching devices, and with each storage capacitor being independently accessed by one pair of gate electrodes in that NEM switching device.

* * * * *